(12) United States Patent
Vilas Boas et al.

(10) Patent No.: US 8,896,349 B2
(45) Date of Patent: Nov. 25, 2014

(54) LOW VOLTAGE DETECTOR

(75) Inventors: Andre Luis Vilas Boas, Campinas (BR); Alfredo Olmos, Austin, TX (US); Edgar Mauricio Camacho Galeano, Campinas (BR); Fabio de Lacerda, Niteroi (BR)

(73) Assignee: Freescale Semiconductor, Inc., Austin, TX (US)

( * ) Notice: Subject to any disclaimer, the term of this patent is extended or adjusted under 35 U.S.C. 154(b) by 666 days.

(21) Appl. No.: 13/161,954

(22) Filed: Jun. 16, 2011

(65) Prior Publication Data

US 2012/0323508 A1    Dec. 20, 2012

(51) Int. Cl.
*H03K 5/153* (2006.01)

(52) U.S. Cl.
USPC ............................................ 327/77; 327/513

(58) Field of Classification Search
USPC .................. 327/72, 77, 512, 513; 374/178
See application file for complete search history.

(56) References Cited

U.S. PATENT DOCUMENTS

| | | | |
|---|---|---|---|
| 5,070,295 A | 12/1991 | Morigami | |
| 5,196,833 A | 3/1993 | Kemp | |
| 5,847,586 A | 12/1998 | Burstein et al. | |
| 7,880,528 B2 * | 2/2011 | Igarashi | 327/512 |
| 8,072,259 B1 * | 12/2011 | Isik | 327/538 |
| 2003/0122590 A1 | 7/2003 | O | |
| 2003/0227306 A1 | 12/2003 | Di Iorio | |
| 2005/0264971 A1 * | 12/2005 | Morino | 361/103 |
| 2011/0148472 A1 * | 6/2011 | Utsuno | 327/88 |
| 2012/0242398 A1 * | 9/2012 | Olmos et al. | 327/512 |

OTHER PUBLICATIONS

Camacho-Galeano, E.M., et al., "Temperature Performance of Sub-1V Ultra-Low Power Current Sources", International Symposium on Circuits and Systems, May 18-21, 2008, Proceedings of ISCAS, 2008, pp. 2230-2233.

* cited by examiner

*Primary Examiner* — Quan Tra (57) ABSTRACT

A low voltage detector (100) includes a power supply voltage monitor circuit (110) that produces a voltage $V_{SP}$ related to a first a power supply voltage, and a voltage generator (105), which includes a plurality of self-cascode MOSFET (SCM) structures (101-103) in a cascade configuration, that generates a reference voltage $V_{xm}$. A voltage comparator (140) outputs an output signal in response to a differential between $V_{xm}$ and $V_{SP}$, wherein $V_{xm}$ and $V_{SP}$ have proportional to absolute temperature behavior (PTAT) over temperature with respect to a second power supply voltage. The output signal changes state when the first power supply voltage equals a trip point of the comparator. Each SCM structure is sized to provide a rate of change with temperature of the PTAT behavior of $V_{xm}$ that matches a rate of change with temperature of the PTAT behavior of $V_{SP}$.

20 Claims, 3 Drawing Sheets

LOW VOLTAGE DETECTOR

BACKGROUND

1. Field

This invention relates generally to voltage detector circuits, and more specifically to a low power consumption, low voltage detector circuit.

2. Related Art

Electronic devices frequently employ a voltage detector to indicate if a particular voltage is outside a specified range. For example, a battery operated device often includes a voltage detector to provide a low voltage indication when the voltage supplied by a battery decreases below a predetermined level. The low voltage indication can notify a user of the device that the battery should be replaced or recharged. Usually, a reliable low-power, low voltage detector consumes hundreds of microamperes because it requires one or more voltage dividers and a bandgap reference voltage to operate properly.

There are current-based, low voltage detectors, but they require nonstandard CMOS devices such as bipolar transistors and non-volatile memory (NVM) cells.

Some known low voltage detectors use ladder resistors to generate voltage taps needed to detect a trip point. The ladder resistors are usually large so that known low voltage detectors consume low power. Large ladder resistors may cause such known low voltage detectors to occupy a disadvantageously large area.

With some known low voltage detectors, the trip-point depends on a threshold voltage $V_{th}$ of a metal oxide semiconductor field effect transistor (MOSFET). The threshold voltage of a MOSFET depends upon process, and the threshold voltage changes greatly with temperature. When a low voltage detector uses a reference voltage that depends upon the threshold voltage, a part-to-part variation of the low voltage detector is disadvantageously great. Therefore, such a low voltage detector is either disadvantageously affected by temperature changes, or it requires additional circuitry that provides temperature compensation but which consumes additional power. Moreover, such a low voltage detector may need trimming to counterbalance the part-to-part variation.

Using the Advanced Compact Model (ACM) for a MOSFET, the inversion level of the MOSFET is determined by an inversion factor $i_f$ which is defined as $i_f = I/I_s$, where I is a drain current of the MOSFET, and $I_s$ is a normalization current. The normalization current $I_s$ is equal to $I_{SQ}S$, where $I_{SQ}$ is a sheet specific current that is defined by certain process parameters and S is an aspect ratio of the MOSFET. The aspect ratio S of the MOSFET is a ratio of channel width W to channel length L. Furthermore, $$I_{SQ} = n\mu C'_{ox}(\Phi_T^2/2)$$

where μ is a mobility of the carriers in the channel, n is a slope factor, $C'_{ox}$ is an oxide capacitance per unit area of the gate of the MOSFET, and $\Phi_T$ is a thermal voltage.

The thermal voltage $\Phi_T$ is a function of temperature and increases directly proportionately with increasing temperature. The thermal voltage is $\Phi_T = kT/q$, where T is the temperature measured in kelvins (abbreviated "K", and sometimes informally referred to as "degrees Kelvin"), and q is the magnitude of the electrical charge of an electron ($1.6022 \times 10^{-19}$ coulombs). The Boltzmann's constant, k, can be expressed as $1.3807 \times 10^{-23}$ joules per kelvin. The thermal voltage $\Phi_T$ is approximately 25.85 millivolts at room temperature (approximately 300K). At room temperature, the thermal voltage $\Phi_T$ changes at a rate of approximately 0.086 millivolts per degree Celsius.

In ACM, the relationship between current and voltage are given by:

$$\frac{V_P - V_S}{\Phi_T} = \sqrt{1 + i_f} - 2 + \ln(\sqrt{1 + i_f} - 1)$$

and $$V_P \cong \frac{V_{GB} - V_{T0}}{n}$$

where $V_P$ is a pinch-off voltage, $V_S$ is a voltage at a source terminal, $V_{GB}$ is a gate-to-bulk voltage, and $V_{T0}$ is a zero bias threshold voltage.

Weak inversion, moderate inversion and strong inversion describe different operational modes of a MOSFET. Weak inversion occurs when a drain current of a MOSFET transistor is dominated by a diffusion current, moderate inversion is when the drain current has both diffusion current and drift current components, and strong inversion is when the drain current is dominated by the drift current. In a MOSFET, inversion occurs when a thinner channel is formed in the transistor in the substrate region under the gate. When there is no channel, the transistor is at cut-off. As a rule of thumb, a MOSFET that has an inversion factor of less than "1" is said to be in weak inversion; a MOSFET that has an inversion factor of about "1" to "100" is said to be in moderate inversion; and a MOSFET that has an inversion factor of greater than "100" is said to be in strong inversion.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
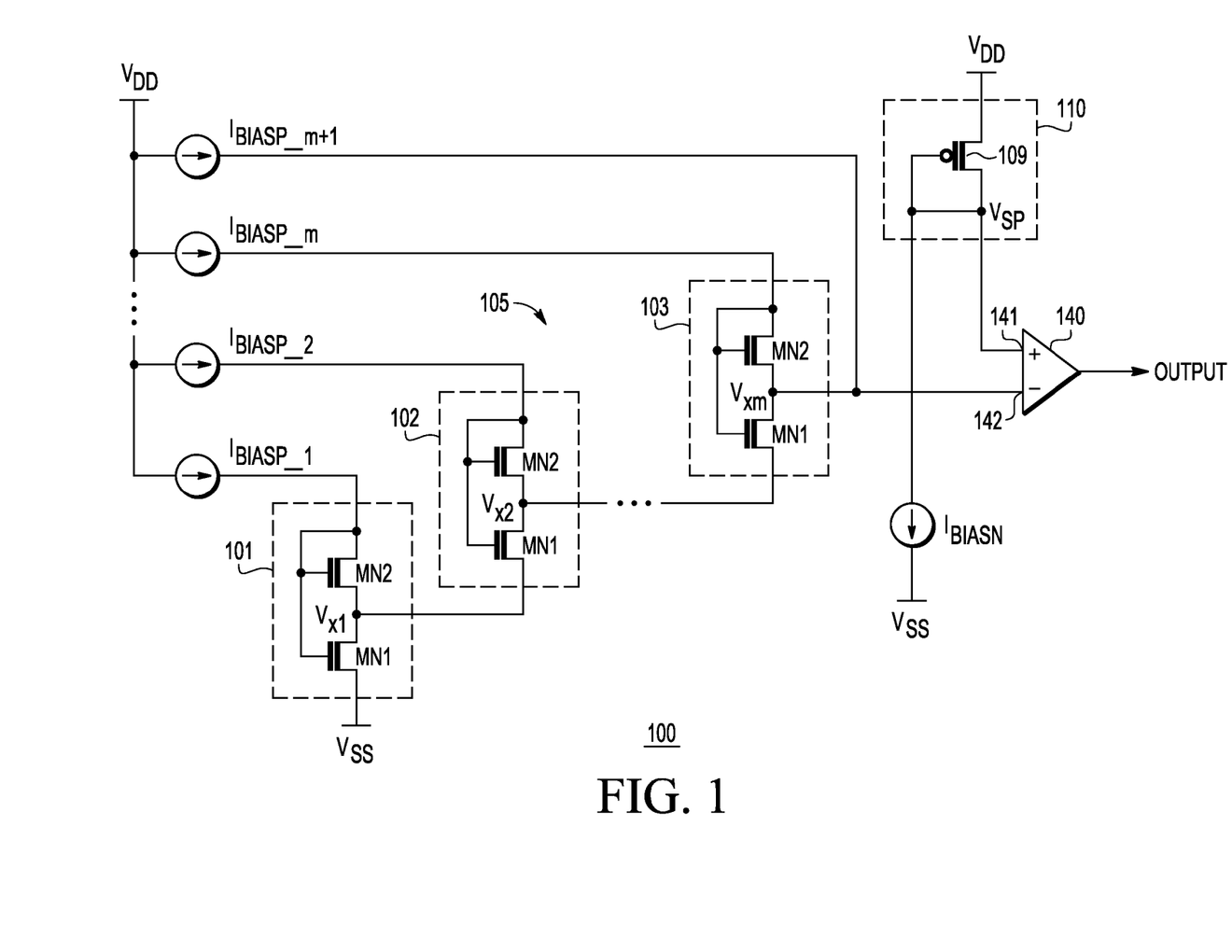
FIG. 1 is a schematic of one embodiment of a low voltage detector in accordance with the invention.

FIG. 1 is a schematic of a low-power, low voltage detector (LVD) 100 in accordance with the invention, which, in some embodiments, achieves reliable low voltage detection while consuming power in a nanowatt range. The LVD 100 advantageously self-compensates for changes in its temperature.

In one embodiment, the LVD 100 comprises a proportional to absolute temperature (PTAT) voltage generator 105, a power supply voltage monitor 110, and a voltage comparator (hereinafter "comparator") 140. In one embodiment, the comparator 140 is a low power consumption comparator. In one embodiment, the LVD 100 is disposed on a substrate of an integrated circuit. The LVD 100 may be coupled to a nanowatt-range current reference that provides bias currents, $I_{BIASN}$ and $I_{BIASP\_1}$ to $I_{BIASP\_m+1}$, for the LVD. Besides consuming low power, such a nanowatt-range current reference should operate down to, or below, a minimum trip point of the LVD 100. In other words, if the trip point of the LVD 100 is set from 1.1V to 1.4V, such a nanowatt-range current reference should operate properly at 1.1V. It would be even better if such a nanowatt-range current reference operates properly down to 1.0V, to have some margin.

In one embodiment, the power supply voltage monitor 110 comprises a PMOS transistor 109. The PMOS transistor 109 is configured as a forward-biased diode, with its gate connected to its drain. A source terminal of the PMOS transistor 109 is coupled to a first power supply terminal which has a potential of $V_{DD}$. In one embodiment, during normal (i.e., not low voltage) conditions, the potential of $V_{DD}$ is 3V. A drain terminal of the PMOS transistor 109 is at a voltage $V_{SP}$ and is coupled to a nanoampere-range current sink that supplies the bias current $I_{BIASN}$. In one embodiment, the bias current $I_{BIASN}$ is approximately 5 nA. The bias current $I_{BIASN}$ can be PTAT, CTAT, or have zero-dependence-to-absolute-temperature (ZTAT), i.e., there are no restrictions for the behavior of the bias current over temperature. A size of the PMOS transistor 109 is such that the bias current $I_{BIASN}$ biases it to operate in the saturation region and in moderate inversion. The drain terminal of the PMOS transistor 109 is also coupled to a non-inverted input terminal 141 of the comparator 140. In another embodiment (not shown), the power supply voltage monitor circuit 110 includes a diode having an anode terminal coupled to the first power supply terminal and a cathode terminal coupled to the voltage comparator 140 in which a voltage drop across the diode is an absolute value of a threshold voltage $V_{th}$, and in which $V_{SP} \approx V_{DD} - |V_{th}|$. In still another embodiment (not shown), the power supply voltage monitor circuit 110 may include more than one active device.

A source-to-drain $V_{SD}$ voltage drop in the PMOS transistor 109 is mainly controlled by a PMOS threshold voltage $V_{thP}$ because, in saturation or active region, for a PMOS diode configuration, $V_{SD}$ is given by:

$$V_{SD} = V_{SG} = |V_{thP}| + \sqrt{\frac{2I_{BIASN}}{\mu_p C'_{ox}(W_{109}/L_{109})}}$$

where $V_{SG}$ is a source-to-gate voltage of PMOS transistors 109, $|V_{thP}|$ is an absolute value of the PMOS threshold voltage, $\mu_p$ is mobility of the carriers (i.e., the holes for a PMOS transistor) in the channel and near the silicon surface, $C_{ox}'$ is gate capacitance per unit area, and $(W_{109}/L_{109})$ is an aspect ratio $S_{109}$ of PMOS transistor 109, with $W_{109}$ and $L_{109}$ being a channel width and a channel length, respectively, of the PMOS transistor. The square root term is the effective voltage ($V_{eff}$) of PMOS transistor 109. With $I_{BIASN}$ in the range of a few nanoamperes (i.e., 5 nA), $\mu_p C_{ox}$ about 30 μA/V² for a standard CMOS technology process, and $(W_{109}/L_{109})$ about (1/10) to maintain PMOS transistor 109 in moderate inversion, $V_{eff}$ becomes in the range of a few tens of millivolts (mV). Because the PMOS threshold voltage in a standard CMOS technology is in the range of hundreds of mV, it can be said that the source-to-drain voltage of PMOS transistor 109 is, therefore, mainly controlled by $|V_{thP}|$.

The value of $V_{thP}$ decreases as the temperature of the PMOS transistor 109 increases. The rate of change of $V_{thP}$ is not controllable by the circuit of the LVD 100 because the rate of change of $V_{thP}$ is a process-dependent parameter. A design of the LVD 100 assumes that the rate of change of $V_{thP}$ is near the rate of change of $V_{thP}$ that is predicted by theoretical models. The parameter $V_{thP}$ has a complementary to absolute temperature (CTAT) behavior with respect to a voltage at the source terminal of the PMOS transistor 109. The voltage at the source terminal of PMOS transistor 109 is $V_{DD}$, which is also the voltage being monitored by the LVD 100.

The power supply voltage $V_{DD}$ may vary, which is a reason that it is being monitored by the LVD 100. However, for purposes of analysis, assume that $V_{DD}$ is fixed, and that the temperature of the PMOS transistor 109 is varied. For example, when the temperature is −40° C., a monitored voltage $V_{SP}$ generated by the power supply voltage monitor 110 may be 700 mV below $V_{DD}$. At +125° C., $V_{SP}$ may be 500 mV below $V_{DD}$. Therefore, because $V_{SP}$ increases ($V_{thP}$ going from 700 mV to 500 mV) with respect to $V_{DD}$ as temperature increases (going from −40° C. to +125° C.), $V_{thP}$ has a CTAT behavior with respect to $V_{DD}$ while $V_{SP}$ has a PTAT behavior with respect to $V_{SS}$. The variation in $V_{SP}$ with temperature is due to the variation in $V_{thP}$ with temperature. The voltage $V_{SP}$ at the non-inverted input 141 of the comparator 140 is approximately equal to one $V_{thP}$ below $V_{DD}$ because:

$$V_{SP} = V_{DD} - V_{SD} = V_{DD} - \left\{ |V_{thP}| + \sqrt{\frac{2I_{BIASN}}{\mu_p C'_{ox}(W_{109}/L_{109})}} \right\} \cong V_{DD} - |V_{thP}|$$

The PTAT voltage generator 105 comprises one or more self-cascode MOSFET (SCM) structures 101-103. An SCM structure (hereinafter "SCM") is appropriate for low-power applications because it can be biased with a very small amount of current, i.e., in the range of a few nanoamperes. Because, in some embodiments, an SCM does not include any resistors, the LVD 100 occupies less area on an integrated circuit than the area occupied by known low voltage detectors implemented with ladder resistors. The LVD 100 uses the one or more SCMs 101-103 to generate a reference voltage $V_{xm}$ with a similar temperature variation coefficient as the temperature variation coefficient of the monitored voltage $V_{SP}$. The PTAT voltage generator 105 may be coupled to the nanowatt-range current reference (not shown), which may supply the bias current $I_{BIASP\_i}$ to each SCM 101-103.

In FIG. 1, three SCMs are illustrated SCM_1 101, SCM_2 102 and SCM_m 103. FIG. 1 shows three (3) SCMs coupled together in a cascade configuration. However, as indicated by the ellipsis in FIG. 1, the PTAT voltage generator 105 may comprise more than three SCMs, i.e., the PTAT voltage generator may comprise m SCMs coupled together in a cascade configuration. Each SCM 101-103 comprises two NMOS transistors connected in a self-cascode configuration: NMOS transistor MN2, which is connected in a diode configuration, and NMOS transistor MN1. In one embodiment, each SCM 101-103 is identical; therefore, only SCM 101 will be described in detail. A drain terminal of NMOS transistor MN2 of SCM 101 is coupled to a nanowatt-range current source, which supplies a bias current $I_{BIASP\_1}$. A source terminal of NMOS transistor MN2 is connected to a drain terminal of NMOS transistor MN1 of SCM 101. A source terminal of NMOS transistor MN1 is coupled to a second power supply terminal which has a potential of $V_{SS}$. In one embodiment, $V_{SS}$ is at ground potential. The SCM 101 provides a PTAT voltage $V_{x1}$ at a node between the source terminal of NMOS transistor MN2 and the drain terminal of NMOS transistor MN1. A source terminal of NMOS transistor MN1 of SCM 102 is coupled to the node of SCM 101 that provides a PTAT voltage $V_{x1}$. Each SCM 101-103 generates a PTAT voltage $V_x$, at the drain terminal of the first NMOS transistor MN1.

In one embodiment, the $I_{BIASP\_i}$ current of each SCM 101-103 is identical. Therefore, the current through NMOS transistor MN1 of SCM_1 101 is (m+1) times the bias current $I_{BIASP\_i}$ (assuming that there is no trimming current). Each of the $I_{BIASP\_i}$ currents is in the range of a few nanoamperes; therefore, the LVD 100 is a low-power, low voltage detector. In one embodiment, each of the $I_{BIASP\_i}$ currents is approximately 5 nA. Each of the $I_{BIASP\_i}$ currents can be PTAT, CTAT, or have zero-dependence-to-absolute-temperature (ZTAT), i.e., there are no restrictions for the behavior of the bias current over temperature. For a given fabrication technology, as the $I_{BIASP\_i}$ currents are reduced, the size of the NMOS transistors MN2 and MN1, i.e., the area of the SCMs, needs to be increased to maintain the transistors MN2 and MN1 in moderate inversion.

NMOS transistor MN1 operates in the triode, or linear, region. NMOS transistor MN2 operates in the saturation region. The aspect ratio $S_{MN1}$ of NMOS transistor MN1 and the aspect ratio $S_{MN2}$ of NMOS transistor MN2 are selected so that NMOS transistor MN1 acts as a large resistor. Typically, $S_{MN2}$ of NMOS transistor MN2 is several times larger than $S_{MN1}$ of NMOS transistor MN1.

The SCMs 101-103 are biased such that they operate in moderate inversion to save silicon area. For low-power applications, the current flowing through NMOS transistor MN1 should be in the range of a few nanoamperes. Therefore, to operate in strong inversion would require a smaller aspect ratio for NMOS transistor MN1, i.e. a larger channel length L for a given channel width W. Hence, a better trade-off between area and power is attained when NMOS transistor MN1 operates in moderate inversion. In another embodiment, when saving silicon area may not be a primary consideration, each SCM 101-103 is configured to operate in moderate to strong inversion.

In some embodiments, the SCMs 101-103 do not operate in strong inversion because if they did operate in strong inversion the area that each SCM occupies would be much larger, and the number of SCMs needed would be the same as if they were operating in moderate inversion; therefore, the area that such a PTAT voltage generator occupies would be disadvantageously larger. In some embodiments, the SCMs 101-103 do not operate in weak inversion because if they did operate in weak inversion the PTAT voltage $V_{x1}$, $V_{x2}$ and $V_{xm}$ that each SCM 101, SCM 102 and SCM 103 respectively contribute would be much smaller and a greater number of SCMs would be needed than the number of SCMs needed if they were operating in moderate inversion. Furthermore, the slightly smaller area occupied by SCMs that operate in weak inversion would not offset the greater number of SCMs needed; therefore, the area that such a PTAT voltage generator 105 occupies would be disadvantageously larger.

The SCMs 101-103 are appropriate for low-power applications because they can be biased with a very small amount of current, i.e., in the range of 5 nA. Advantageously, in the illustrated embodiments, the SCMs 101-103 do not include any resistors, and, therefore, the SCMs occupy less area than the area occupied by known PTAT generator circuits that include resistors or bipolar transistors.

Each SCM 101-103 provides a PTAT voltage $V_{xi}$, with respect to the source voltage of its NMOS transistor MN1, in the range of tens to a few hundred of millivolts. $V_{xi}$ depends on the thermal voltage kT/q, the inversion factor $i_{f2}$ of NMOS transistor MN2 and on a parameter $\alpha_i$. Disregarding the body effect, and using the ACM equations shown above, it can be shown that $$V_{xi} = \frac{kT}{q}\left[\sqrt{1+\alpha_i i_{f2}} - \sqrt{1+i_{f2}} + \ln\left(\frac{\sqrt{1+\alpha_i i_{f2}}-1}{\sqrt{1+i_{f2}}-1}\right)\right]$$

and assuming $I_{BIASP\_1} = I_{BIASP\_2} = \ldots = I_{BIASP\_m} = I_{BIASP\_m+1}$, $$\alpha_i = 1 + \frac{S_{MN2}}{S_{MN1}}\left(1 + \frac{1}{m+1-i}\right) \quad \text{Equation (1)}$$

The LVD 100 uses a PTAT voltage $V_{xm}$ that is in a range of hundreds of millivolts; therefore, in one embodiment, a plurality of m SCMs are cascaded together to form the PTAT voltage generator 105. The number of SCMs in the PTAT voltage generator 105 depends on the value of the trip point of the LVD 100, the threshold voltage $V_{thP}$ of the PMOS transistor 109, and the bias current $I_{BIASP\_i}$. The PTAT voltage generator 105 provides a PTAT voltage $V_{xm}$ at an inverted input 142 of the comparator 140. As a result, the amount of variation with temperature of the voltage $V_{xm}$ at the inverted input 142 of the comparator 140 is adjusted to match the amount of variation with temperature of the voltage $V_{SP}$ at the non-inverted input 141 of the comparator 140. Such match can be accomplished because $V_{SP}$ varies with temperature in a same direction as $V_{thP}$ varies with temperature.

Because the voltage $V_{SP}$ generated by the power supply voltage monitor 110 and the voltages $V_{xm}$ generated by the PTAT voltage generator 105 have similar temperature coefficients (in one embodiment, PTAT temperature coefficients) by design, the variation with temperature of the trip point of the LVD 100 is greatly reduced compared to the trip point of known low voltage detectors. Advantageously, the LVD 100 also has low sensitivity to variations in the threshold voltage $|V_{thP}|$.

The SCMs 101-103 are configured such that the rate of change of $V_{xm}$ with temperature matches the rate of change of $V_{thP}$ of the PMOS transistor 109. This is accomplished by selecting a parameter $\chi$ for the PTAT voltage generator 105. The parameter $\chi$ is a function of the number m of SCMs, the parameter $\alpha$ and the inversion factor $i_{f2}$, and can be expressed as $$\chi = \sum_{i=1}^{m}\left[\left(\sqrt{1+\alpha_i i_{f2}} - \sqrt{1+i_{f2}}\right) + \ln\left(\frac{\sqrt{1+\alpha_i i_{f2}}-1}{\sqrt{1+i_{f2}}-1}\right)\right]$$

where $\alpha_i$ is given by Equation (1) with i from 1 to m.

From the above equations, it can be shown that $$V_{xm} = \chi\frac{kT}{q} = \chi\Phi_T$$

Hence, the variation with temperature of $V_{xm}$ is given by:

$$\frac{\partial V_{xm}}{\partial T} = \chi\frac{k}{q}$$

Then, by design, the SCMs 101-103 are sized to provide a parameter x that allows the variation with temperature of $V_{xm}$ to match the rate of change with temperature of the threshold voltage $V_{thP}$ of the PMOS transistor 109 over corner process.

In another embodiment (not shown) some or all of the SCMs of the PTAT voltage generator 105 are not identical to each other, and some or all of the $I_{BIASP\_i}$ currents are not identical to each other.

In the one embodiment, where the normal operating potential of $V_{DD}$ is 3V, the LVD 100 sets a flag (i.e., the output of the comparator 140 changes state) when $V_{DD}$ drops to 1.2V. For a trip point of 1.2V, the output of the comparator 140 needs to change state when $V_{DD}$ reaches 1.2V. Assume, at room temperature, that there is a 600 mV drop across the PMOS transistor 109. This means that there is 600 mV at the non-inverted input 141 of the comparator 140 when $V_{DD}$ is 1.2V. Therefore, to have a 1.2V trip point for the LVD 100 (i.e., to have the output of the comparator 140 change state when $V_{DD}$ reaches 1.2V), the voltage at node $V_{xm}$ should also be 600 mV. Therefore, the PTAT voltage generator 105 needs to provide, and does provide, 600 mV. In this example, if $V_{DD}$>1.2V, then $V_{SP}$>600 mV, and the output of the comparator 140 does not change state. In this example, if $V_{DD}$<1.2V, then $V_{SP}$<600 mV, and the output of the comparator 140 does change state. In this example, the PTAT voltage generator 105 is designed, and the $I_{BIASP\_i}$ currents are selected, so that $V_{xm}$ is 600 mV at room temperature (+27° C.), is approximately 500 mV at −40° C., and is approximately 700 mV at +125° C.

Figure 2:
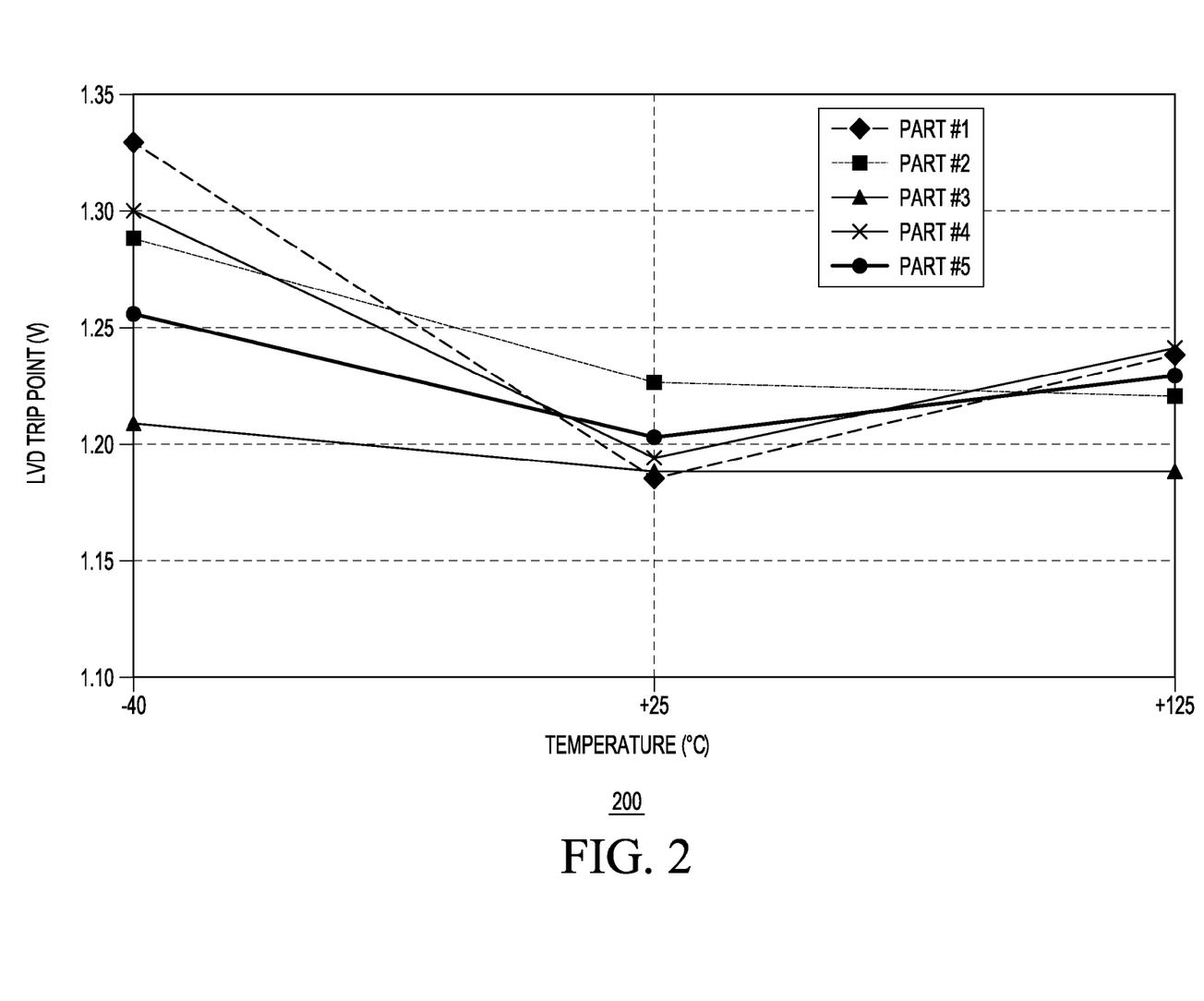
FIG. 2 is a graph of trip point versus temperature for the low voltage detector of FIG. 1.

A typical low-power, low voltage detector often has a wide permissible range of variation of the trip point with respect to temperature, such as a range of 1.1V to 1.4V. FIG. 2 is a graph of the LVD trip point versus temperature of the LVD 100 when fabricated with a 0.18 μm standard CMOS technology. FIG. 2 is a graph of the LVD trip point versus temperature of the LVD 100 when m=3, $I_{BIASN}$=5 nA and each $I_{BIASP\_i}$=5 nA. FIG. 2 demonstrates that the trip point of the LVD 100 is well within the range of 1.1V to 1.4V at cold temperatures, e.g., −40° C., at hot temperatures, e.g., +125° C., and at approximately room temperature, e.g., +25° C. FIG. 2 also demonstrates that the trip point of the LVD 100 has a relatively small part-to-part variation. Advantageously, the LVD 100 may not require trimming. For a narrower range in the variation of the trip point with respect to temperature, trimming can be added to the LVD 100. In one embodiment, trimming would include trimming the bias current $I_{BIASP\_i}$ of one or more SCM 101-103. Trimming the bias current $I_{BIASP\_m+1}$ of only SCM 103 is most efficient since it has the most impact because the current entering in node $V_{xm}$ of SCM 103 flows through all the SCMs 101-103 before going to $V_{SS}$. The purpose of any trimming is to make a rate of change with temperature of $V_{xm}$ more nearly equal to a rate of change with temperature of $V_{SP}$.

The LVD 100 has been described as including the power supply voltage monitoring circuit 110 and the voltage generator 105, each producing a voltage ($V_{SP}$ and $V_{xm}$, respectively) that has PTAT behavior with respect to $V_{SS}$. It is also possible for the LVD 100 to function properly if, in another embodiment (not shown), the power supply voltage monitoring circuit 110 and the voltage generator 105 were made to each generate a voltage ($V_{SP}$ and $V_{xm}$, respectively) that has CTAT behavior with respect to $V_{SS}$. This can be pictured by mirroring/flipping most of the circuit of the LVD 100 about an imaginary horizontal axis of FIG. 1, and by exchanging NMOS transistors with PMOS transistors, and vice versa. The bias currents are also changed (from current sources to current sinks, and vice versa). There is no need to flip the comparator 140 or to alter its bias current. In such other embodiment, $V_{SP}$ and $V_{xm}$ are exchanged. In other words, in such other embodiment, the voltage drop in transistor 109 connected as a diode becomes the reference voltage $V_{xm}$ for the comparator 140, and the output voltage of the plurality of SCMs becomes the monitored voltage $V_{SP}$. Then, the variation with temperature of $V_{SP}$ is adjusted to match the variation with temperature of the threshold voltage of transistor 109 (which has become an NMOS transistor in such other embodiment). In such other embodiment, $V_{SP}$ and $V_{xm}$ remain connected to the comparator 140 as shown in FIG. 1, i.e., with $V_{SP}$ coupled to the non-inverted input 141 and with $V_{xm}$ coupled to the inverted input 142 of the comparator. In such other embodiment, NMOS transistor 109 has its gate terminal connected to its drain terminal, and its source terminal coupled to $V_{SS}$. In such other embodiment, SCM 101 comprises two PMOS transistors connected in a self-cascode MOSFET configuration: PMOS transistor MP2, which is connected in a diode configuration, and PMOS transistor MP1. In such other embodiment, each SCM 101-103 is identical. A drain terminal of PMOS transistor MP2 of SCM 101 is coupled to a nanowatt-range current sink that supplies a bias current $I_{BIASN\_1}$. A source terminal of PMOS transistor MP2 is connected to a drain terminal of PMOS transistor MP1 of SCM 101. A source terminal of PMOS transistor MP1 is coupled to $V_{DD}$. The SCM 101 provides a PTAT voltage $V_{x1}$ at a node between the source terminal of PMOS transistor MP2 and the drain terminal of PMOS transistor MP1 with respect to the source terminal of PMOS transistor MP1, which is coupled to $V_{DD}$. Hence, the voltage $V_{x1}$ is CTAT with respect to $V_{SS}$. A source terminal of PMOS transistor MP1 of SCM 102 is coupled to a node of SCM 101 that provides a CTAT voltage $V_{x1}$ with respect to $V_{SS}$. Each SCM 101-103 generates a CTAT voltage $V_{xi}$ with respect to $V_{SS}$ at the drain terminal of the first PMOS transistor MP1.

Figure 3:
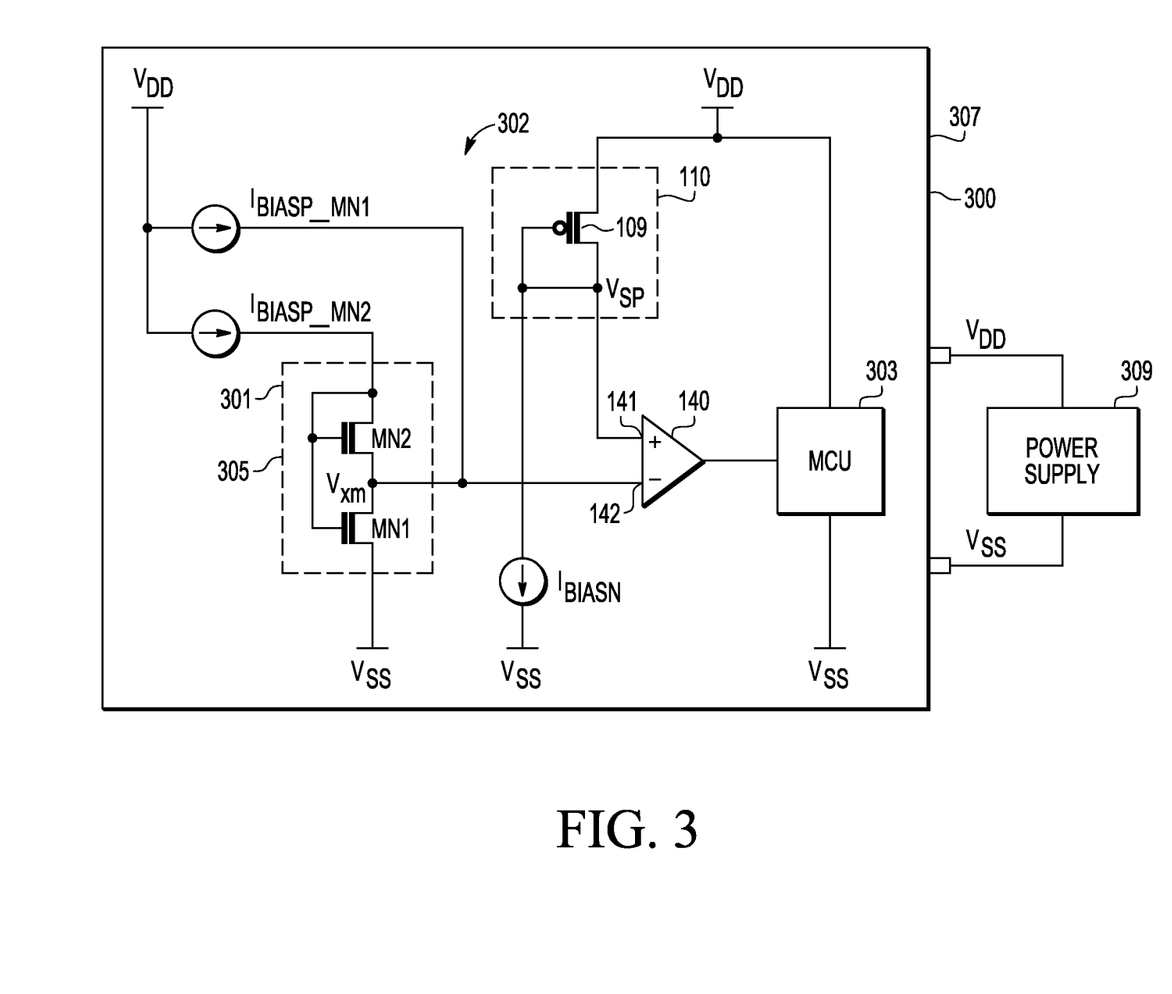
FIG. 3 illustrates a schematic of a System-on-Chip (SoC) that includes another embodiment of the low voltage detector in accordance with the invention.

FIG. 3 illustrates a schematic of a System-on-Chip (SoC) 300. The SoC 300 comprises an LVD 302 and a microcontroller unit (MCU) 303. The LVD 302 comprises a PTAT voltage generator 305 that includes, in one embodiment, only one SCM 301. Other embodiments of the PTAT voltage generator 305 may include more than one SCM. A drain terminal of NMOS transistor MN2 of SCM 101 is coupled to a nanowatt-range current source, which supplies a bias current $I_{BIASP\_MN2}$. A drain terminal of NMOS transistor MN1 of SCM 101 is coupled to the nanowatt-range current source, which supplies a bias current $I_{BIASP\_MN1}$. An output of the LVD 302 is coupled to the MCU 303. The LVD 302 and the MCU 303 are disposed on a substrate of an integrated circuit 307. The SoC 300 may be coupled to a power supply 309. The LVD 302 monitors the voltage of the power supply 309. The LVD 302 assures a safe operating state even when the minimum supply voltage specification of the SoC 300 is violated. The LVD 302 operates with a very low quiescent current for stand-by and/or low-power operation modes of the MCU 303.

In some embodiments, the LVD 100 and 302 advantageously does not employ bipolar arrays, resistors arrays or an operational amplifier, as do some known low voltage detectors; therefore, the LVD 100 and 302 occupies a smaller area than the area occupied by some known low voltage detectors.

In some embodiments, the LVD 100 and 302 can operate with a low voltage power supply (i.e., <1.5V), has high reusability and low manufacturing cost, and consumes very little power. In one embodiment, the LVD consumes less than 100 nA.

In one embodiment, all the transistors of the LVD 100 and 302 (including the transistors of the comparator 140) consist of only MOSFETs. The use of only MOSFETs allows achieving small silicon area as well as compatibility with standard CMOS technologies.

The LVD 100 and 302 includes terminals for coupling to a first power supply terminal $V_{DD}$ and to a second power supply terminal $V_{SS}$ of a power supply. The LVD 100 and 302 includes the power supply voltage monitor circuit 110 for monitoring the voltage $V_{DD}$ at the first power supply terminal and for producing the voltage $V_{SP}$ related to the voltage $V_{DD}$ at the first power supply terminal. The LVD 100 and 302 also includes the voltage generator 105 for generating the reference voltage $V_{xm}$. The voltage generator 105 includes the plurality of self-cascode MOSFET (SCM) structures 101-103 arranged in a cascade configuration, and the voltage comparator 140, which is coupled to the power supply voltage monitor circuit 110 and to the voltage generator 105. The voltage comparator 140 outputs an output signal in response to a differential between $V_{xm}$ and $V_{SP}$. The voltages $V_{xm}$ and $V_{SP}$ have a same behavior with respect to temperature. The LVD 100 and 302 has a trip point. The output signal changes state when the voltage $V_{DD}$ at the first power supply terminal of the power supply equals the voltage of the trip point.

The SoC 300 includes the MCU 303 which is disposed on the substrate of the integrated circuit 307 and which is powered by a power supply 309. The SoC 300 also includes the LVD 100 and 302 which is also disposed on the substrate of the integrated circuit 307. The LVD 100 and 302 is coupled to the MCU 303, to the first power supply terminal $V_{DD}$ of the power supply, and to the second power supply terminal $V_{SS}$ of the power supply. The LVD 100 and 302 includes the voltage generator 105 that produces the voltage $V_{xm}$. The voltage generator 105 includes at least one self-cascode MOSFET (SCM) structure 101-103. The at least one SCM structure 101-103 includes a first transistor MN1 coupled to a second transistor MN2, wherein the second transistor is connected as a diode, and in which one SCM structure 101 of the at least one SCM structure 101-103 is coupled to the second power supply terminal $V_{SS}$ of the power supply and to a current source $I_{BIASP\_1}$ for supplying a bias current to the first transistor and to the second transistor. The LVD 100 and 302 includes the power supply voltage monitor circuit 110, which is coupled to the first power supply terminal $V_{DD}$ of the power supply and to the current sink $I_{BIASN}$, and which produces the voltage $V_{SP}$ that is related to a voltage at the first power supply terminal $V_{DD}$. The LVD 100 and 302 also includes the voltage comparator 140, which is coupled to the voltage generator 105 and to the power supply voltage monitor circuit 110, and which outputs an output signal in response to a differential between $V_{xm}$ and $V_{SP}$, wherein $V_{xm}$ and $V_{SP}$ have a same behavior with respect to temperature, wherein the LVD 100 and 302 has a trip point, and wherein the output signal changes state in response to the voltage at the first power supply terminal $V_{DD}$ equaling the voltage of the trip point.

The integrated circuit 307 includes the voltage detector 100 and 302. The voltage detector 100 and 302 includes a power supply voltage monitor circuit 110 that is coupled to a current sink $I_{BIASN}$ and that includes a terminal for coupling to the first power supply terminal $V_{DD}$ of a power supply. The power supply voltage monitor circuit 110 produces a voltage $V_{SP}$ related to a voltage at the first power supply terminal. The voltage $V_{SP}$ has CTAT behavior with respect to the voltage at the first power supply terminal and PTAT behavior with respect to the voltage at a second power supply terminal $V_{SS}$ of the power supply. The voltage detector 100 and 302 also includes the PTAT voltage generator 105 which is coupled to a current source ($I_{BIASP\_1}$ to $I_{BIASP\_m+1}$). The PTAT voltage generator 105, which includes a terminal for coupling to a second power supply terminal $V_{SS}$ of the power supply, produces the voltage $V_{xm}$. The PTAT voltage generator 105 includes at least one self-cascode MOSFET (SCM) structure 101 that produces the voltage $V_{xm}$, wherein $V_{xm}$ has PTAT behavior with respect to a voltage $V_{SS}$ at the second power supply terminal. The voltage detector 100 and 302 also includes the voltage comparator 140, which is coupled to the PTAT voltage generator 105 and to the power supply voltage monitor circuit 110, and which outputs an output signal in response to a differential between $V_{xm}$ and $V_{SP}$. The voltage detector 100 and 302 has a trip point, and the output signal changes state in response to the voltage of the power supply equaling the voltage of the trip point.

Although the invention is described herein with reference to specific embodiments, various modifications and changes can be made without departing from the scope of the present invention as set forth in the claims below. For instance, although the description of one exemplary embodiment of the LVD 100 and 302 states that it is disposed on an integrated circuit, the invention is equally usable when constructed entirely of components consisting of discrete devices.

Although, in one exemplary embodiment, the LVD 100 and 302 is disposed on an integrated circuit fabricated using CMOS technology, the LVD can also be disposed on an integrated circuit fabricated using other technologies. Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A low voltage detector including terminals for coupling to a first power supply terminal and to a second power supply terminal of a power supply, the low voltage detector comprising:
  a power supply voltage monitor circuit for monitoring a voltage at the first power supply terminal and for producing a voltage $V_{sp}$ related to the voltage at the first power supply terminal, the power supply voltage monitor circuit having a temperature variation coefficient;
  a voltage generator, for generating a reference voltage $V_{xm}$ related to a voltage at the second power supply terminal, the voltage generator including a single array of a plurality of self-cascode MOSFET (SCM) structures arranged in a cascade configuration, the voltage generator having a temperature variation coefficient that is similar to the temperature variation coefficient of the power supply voltage monitor circuit; and
  a voltage comparator, having a first comparator input coupled to the power supply voltage monitor circuit for coupling the voltage $V_{SP}$ to the first comparator input, and having a second comparator input coupled to the voltage generator for coupling the voltage $V_{xm}$ to the second comparator input, the voltage comparator for outputting a low voltage detect output signal in response to a differential voltage between $V_{xm}$ and $V_{SP}$, wherein the voltages $V_{xm}$ and $V_{sp}$ have a substantially same voltage rate of change and in a same direction with respect to temperature based on the similar temperature variation coefficient of the power supply voltage monitor circuit and the voltage generator, wherein the low voltage detect output signal changes state when the voltage $V_{SP}$ equals the voltage $V_{xm}$.

2. The low voltage detector of claim 1, in which each SCM structure of the plurality of SCM structures includes a first NMOS transistor and a second NMOS transistor, wherein a drain terminal of the first transistor and a source terminal of the second transistor are connected together, wherein a gate terminal of the first transistor is connected to a gate terminal of the second transistor, and wherein the drain terminal of the first transistor receives a current coming from an adjacent SCM, and in which the gate and drain terminals of the second transistor of each SCM structure of the plurality of SCM structures are connected together and are coupled to a separate current source.

3. The low voltage detector of claim 2, in which the first transistor and the second transistor of each SCM structure of the plurality of SCM structures are sized to provide a rate of change with temperature of $V_{xm}$ that matches a rate of change with temperature of $V_{SP}$.

4. The low voltage detector of claim 2, in which the first transistor of each SCM structure of the plurality of SCM structures operates in a linear region and the second transistor of each SCM structure of the plurality of SCM structures operates in a saturated region, and in which the first transistor and the second transistor are biased to operate in moderate to strong inversion.

5. The low voltage detector of claim 2, in which the plurality of SCM structures includes a first SCM structure in which the first transistor of the first SCM structure has its source terminal coupled to the second power supply terminal, and at least a second SCM structure, and in which the first transistor of the second SCM structure has its source terminal coupled to a node of the first SCM structure at which a drain terminal of the first transistor and a source terminal of the second transistor of the first SCM are connected together.

6. The low voltage detector of claim 2, in which the power supply voltage monitor circuit includes a PMOS transistor having a source terminal coupled to the first power supply terminal, having a drain terminal coupled to the voltage comparator, and having a gate terminal coupled to the drain terminal and to a current sink, the current sink for providing a bias current for the PMOS transistor, and in which $V_{SP}$ is a voltage at the drain terminal.

7. The low voltage detector of claim 6, in which a source-to-drain voltage drop in the PMOS transistor is an absolute value of a PMOS threshold voltage $V_{thP}$, and in which $V_{SP} \approx V_{DD} - |V_{thP}|$.

8. The low voltage detector of claim 1, in which the power supply voltage monitor circuit includes a diode having an anode terminal coupled to the first power supply terminal and a cathode terminal coupled to the voltage comparator, and in which a voltage drop across the diode is an absolute value of a threshold voltage $V_{th}$, and in which $V_{SP} \approx V_{DD} - |V_{th}|$.

9. The low voltage detector of claim 1, in which $V_{SP}$ has complementary to absolute temperature (CTAT) behavior with respect to the voltage at the first power supply terminal, and proportional to absolute temperature (PTAT) behavior with respect to a voltage at the second power supply terminal.

10. The low voltage detector of claim 9, in which $V_{xm}$ has PTAT behavior with respect to the voltage at the second power supply terminal.

11. A System-on-Chip (SoC), comprising:
a microcontroller unit (MCU), disposed on a substrate of an integrated circuit, and powered by a power supply; and
a low voltage detector, disposed on the substrate of the integrated circuit, coupled to the MCU, to a first power supply terminal of the power supply and to a second power supply terminal of the power supply, the low voltage detector including:
a voltage generator for producing a voltage $V_{xm}$, related to a voltage at the second power supply terminal, the voltage generator including a single array of at least one self-cascode MOSFET (SCM) structure, in which the at least one SCM structure includes a first transistor coupled to a second transistor, wherein the second transistor is connected as a diode, and in which one SCM structure of the at least one SCM structure is coupled to the second power supply terminal of the power supply and to a current source for supplying a bias current to the first transistor and to the second transistor, the voltage generator having a temperature variation coefficient that is similar to the temperature variation coefficient of the power supply voltage monitor circuit;
a power supply voltage monitor circuit, coupled to the first power supply terminal of the power supply and coupled to a current sink, for producing a voltage $V_{SP}$ related to a voltage at the first power supply terminal, the power supply voltage monitor circuit having a temperature variation coefficient, and wherein the power supply voltage monitor circuit does not include an array of self-cascode MOSFET (SCM) structure; and
a voltage comparator, having a first comparator input coupled to the voltage generator for coupling the voltage $V_{xm}$ to the first comparator input and having a second comparator input coupled to the power supply voltage monitor circuit for coupling the voltage $V_{SP}$ to the second comparator input, the voltage comparator for outputting a low voltage detect output signal in response to a differential voltage between $V_{xm}$ and $V_{SP}$, wherein the voltages $V_{xm}$, and $V_{SP}$ have a substantially same voltage rate of change and in a same direction with respect to temperature based on the similar temperature variation coefficient of the power supply voltage monitor circuit and the voltage generator, wherein the low voltage detect output signal changes state in response to the voltage $V_{SP}$ being equal to the voltage $V_{xm}$.

12. The SoC of claim 11, in which $V_{xm}$ and $V_{SP}$ have proportional to absolute temperature (PTAT) behavior with respect to the second power supply terminal.

13. The SoC of claim 12, in which the at least one SCM structure is sized to provide a rate of change with temperature of the PTAT behavior of $V_{xm}$ that matches a rate of change with temperature of the PTAT behavior of $V_{SP}$.

14. The SoC of claim 11, in which the power supply voltage monitor circuit includes a transistor, having a conductivity type opposite to a conductivity type of the transistors of the at least one SCM structure, connected as a diode having one current electrode coupled to the first power supply terminal and another current electrode coupled to the voltage comparator, and in which a voltage drop across the current electrodes of the transistor is a threshold voltage $V_{th}$, and wherein $V_{SP} \approx V_{DD} - |V_{th}|$.

15. The SoC of claim 14, in which the at least one SCM structure is sized to provide a rate of change with temperature of $V_{xm}$ that matches a rate of change with temperature of the threshold voltage $V_{th}$ of the transistor of the power supply voltage monitor circuit over corner process.

16. An integrated circuit, comprising:
a voltage level detector, the voltage level detector including:
a power supply voltage monitor circuit, coupled to a current sink and including a terminal for coupling to a first power supply terminal of a power supply, the power supply voltage monitor circuit having a temperature variation coefficient, for producing a voltage $V_{SP}$ related to a voltage at the first power supply terminal, wherein $V_{SP}$ has complementary to absolute temperature (CTAT) behavior with respect to the voltage at the first power supply terminal and proportional to absolute temperature (PTAT) behavior with respect to a voltage at a second power supply terminal of the power supply;
a proportional to absolute temperature (PTAT) voltage generator, coupled to a current source and including a terminal for coupling to a second power supply terminal of the power supply, the PTAT voltage generator having a temperature variation coefficient that is similar to the temperature variation coefficient of the power supply voltage monitor circuit, for producing a voltage $V_{xm}$ related to the voltage at the second power supply terminal, wherein the PTAT voltage generator includes a single array of at least one self-cascode MOSFET (SCM) structure that produces the voltage $V_{xm}$, wherein $V_{xm}$ has PTAT behavior with respect to the voltage at the second power supply terminal; and
a voltage comparator, having a first comparator input coupled to the PTAT voltage generator for coupling the voltage $V_{xm}$ to the first comparator input and having a second comparator input coupled to the power supply voltage monitor circuit for coupling the voltage $V_{SP}$ to the second comparator input, the voltage comparator for outputting a voltage level detect output signal in response to a differential voltage between $V_{xm}$ and $V_{SP}$, wherein the voltages $V_{xm}$ and $V_{SP}$ have a substantially same voltage rate of change and in a same direction with respect to temperature based on the similar temperature variation coefficient of the power supply voltage monitor circuit and the PTAT voltage generator, and wherein the voltage level detect output signal changes state in response to the voltage $V_{SP}$ being equal to the voltage $V_{xm}$.

17. The integrated circuit of claim 16, in which the power supply voltage monitor circuit includes a transistor, having a conductivity type opposite to a conductivity type of the transistors of the at least one SCM structure, the transistor having a first current electrode coupled to the first power supply terminal, having a second current electrode coupled to the voltage comparator, and having a control electrode coupled to the second current electrode and to a current sink, the current sink for providing a bias current for the transistor, and in which $V_{SP}$ is a voltage at the second current electrode.

18. The integrated circuit of claim 17, in which the transistor of the power supply voltage monitor circuit operates in a saturation region and in moderate inversion.

19. The integrated circuit of claim 16, in which each of the at least one SCM structure includes a first NMOS transistor and a second NMOS transistor, wherein the first NMOS transistor of one SCM structure of the at least one SCM structure has its source terminal coupled to a second power supply terminal, its drain terminal connected to a source terminal of the second NMOS transistor, and its gate terminal connected to a gate terminal of the second NMOS transistor, wherein the gate and drain terminals of the second NMOS transistor are connected together and coupled to a current source, and wherein the drain terminal of the first NMOS transistor is coupled to another current source.

20. The low voltage detector of claim 1, wherein $V_{SP}$ is equal to a threshold voltage $V_{th}$ subtracted from the voltage at the first power supply terminal, and wherein $V_{xm}$ and $V_{th}$ have a substantially same voltage rate of change in opposite directions with respect to temperature.

* * * * *